SELF-STARTING TRANSISTOR OSCILLATOR UNIT

Filed May 23, 1955 3 Sheets-Sheet 1

INVENTOR.
RICHARD F. MOREY JR.
BY
William J. Flynn
ATTORNEY

*INVENTOR.*
RICHARD F. MOREY JR.
*BY*
William J. Flynn
ATTORNEY

Dec. 8, 1959 R. F. MOREY, JR 2,916,704

SELF-STARTING TRANSISTOR OSCILLATOR UNIT

Filed May 23, 1955 3 Sheets-Sheet 3

INVENTOR.
RICHARD F. MOREY JR.
BY
William J. Flynn
ATTORNEY 2,916,704

SELF-STARTING TRANSISTOR OSCILLATOR UNIT

Richard F. Morey, Jr., Abington, Mass., assignor, by mesne assignments, to Clevite Corporation, Cleveland, Ohio, a corporation of Ohio Application May 23, 1955, Serial No. 510,483

13 Claims. (Cl. 331—113)

This invention relates to a transistor oscillator unit.

It is an object of this invention to provide a novel and improved transistor oscillator which is especially well suited for use in a power supply for converting low voltage D.C. to a higher voltage.

Another object of this invention is to provide a novel transistor oscillator having provision for positive starting under load.

It is also an object of the present invention to provide a novel transistor oscillator capable generally of good efficiency under various load conditions, and particularly of improved efficiency under loads less than maximum rated load.

Another object of this invention is to provide a novel transistor oscillator having good voltage regulation.

Further it is an object of this invention to provide a novel transistor oscillator which produces a substantially square wave output.

A further object of this invention is to provide a novel transistor oscillator having provision for easily compensating for variations in transistor parameters.

Still another object of this invention is to provide a novel transistor oscillator which ceases to oscillate when heavily overloaded and which, after removal of the overload, recovers and begins to oscillate again.

These objects preferably are accomplished in the present invention by the provision of an audio frequency square wave oscillator which includes a pair of transistors connected in push-pull relation and having transformer feedback coupling between their respective input and output circuits, along with a pair of resistors connected to provide self-starting of the oscillator under load.

Other and further objects and advantages of the present invention will be apparent from the following detailed description of certain preferred embodiments illustrated schematically in the accompanying drawings.

Figure 1:
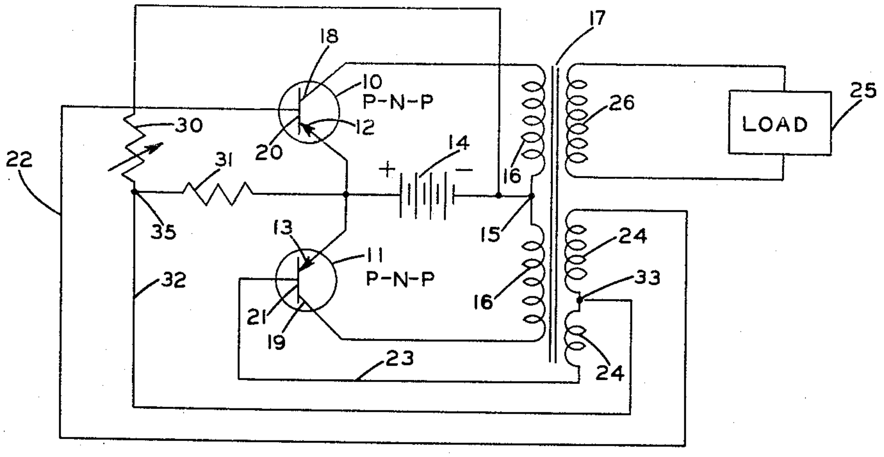
Figure 1 is a circuit diagram of a common-emitter transistor oscillator in accordance with the present invention.

Referring to Fig. 1, the oscillator in accordance with this embodiment of the present invention comprises a pair of P-N-P transistors 10 and 11 connected in push-pull relation. Both emitters 12 and 13 are connected directly to the positive terminal of direct current low voltage source, such as a 6 volt, 12 volt, or 28 volt battery 14. The negative terminal of this battery is connected to the center tap 15 on the primary winding 16 of a transformer 17, which preferably has a core of iron, ferrite or other suitable magnetic material. The opposite ends of this primary winding are connected to the respective collector electrodes 18 and 19 of the transistors 10 and 11. The base electrodes 20 and 21 of the transistors are connected through lines 22 and 23, respectively, to opposite ends of a secondary feedback winding 24 on the core of transformer 17. The load 25 which is operated by the oscillator is connected across another secondary winding 26 on the core of this transformer, this secondary winding being suitably designed to provide the desired voltage step-up from the voltage appearing across the transformer primary.

Each of the transistors 10 and 11 preferably is of a type able to maintain high gain at emitter currents of the order of amperes. In one desirable embodiment, each of these transistors is a P-N-P alloy junction transistor as disclosed and claimed in the co-pending application of Neville H. Fletcher, Serial No. 477,627, assigned to the same assignee as the present invention. Alternatively, other transistors might be employed. If it is desired to use N-P-N transistors, the bias connections for the emitter and collector electrodes would be reversed from the arrangement shown in Fig. 1.

Preferably, the feedback winding 24 has a turns ratio of from 1:5 to 1:10 with respect to the transformer primary 16 to provide a corresponding voltage step-down in the feedback network.

Each of the transistors in Fig. 1 comprises a semiconductor body contacted by the emitter, base and collector electrodes. The base electrode makes low resistance, ohmic contact with the semiconductor body. The emitter electrode makes rectifier contact with the semiconductor body and is biased by battery 14 for current conduction in the forward or low resistance direction. The collector electrode makes rectifier contact with the semiconductor body and is biased for current conduction in the reverse or high resistance direction.

In accordance with the present invention there is provided a resistive impedance arrangement insuring positive starting of the oscillator under load. This impedance arrangement comprises a first resistor 30 having one of its terminals connected directly to the negative terminal of battery 14, which is the bias connection for each collector electrode. A second resistor 31 is connected between the opposite end of resistor 30 and the grounded emitter electrodes. A line 32 is connected between the mid-tap 33 on the feedback winding 24 and the juncture 35 between resistors 30 and 31. Resistor 31 is of the order of 1 to 10 ohms, while resistor 30 is adjusted so that the voltage of the battery 14 divided by the resistance of resistor 30 is of the order of 100 milliamperes current.

Current drawn from the battery by the resistors 30 and 31 flows through resistor 30 and then divides among resistor 31 and the input circuits of the two transistors 10 and 11. The current flowing in the emitter-base portion of each transistor depends upon the input resistance of the transistor. The voltage induced across the feedback winding 24 of the transformer 17 is essentially a square wave of such polarity that it forward biases the emitter-base diode of the transistor that is starting to conduct collector current and reverse biases the emitter-base diode of the other transistor. The transistor whose emitter-base diode is thus forward-biased presents a very low input resistance, which draws most of the starting current drained from battery 14, while the other transistor whose emitter-base diode is reverse-biased presents a high input resistance and therefore draws little current. Obviously, resistor 31 should have a sufficiently high ohmic value that it does not shunt too much current from the conducting transistor.

Due to unavoidable asymmetry in the disclosed circuit, one or the other of the transistors spontaneously will start to conduct current. The following is offered as an explanation of the action which takes place in the oscillator under certain operating conditions without, however, intending to limit this invention to this particular theory of operation:

Assuming that transistor 10 begins to conduct first, the change of current at collector 18 produces a voltage across the upper half of the transformer primary 16 which drives the voltage at this collector increasingly more positive than the potential at the negative battery terminal. The voltage across the transformer primary 16 induces in the transformer secondary feedback winding 24 a voltage which drives the base 20 negative with respect to emitter 12, thereby causing the base 20 to draw more current. This is reflected as a further increase in the current at collector 18, which in turn causes a greater voltage across the upper half of the transformer primary 16, so that the voltage at collector 18 approaches the voltage at emitter 12. Accordingly, the voltage drop across the upper half of the transformer primary is substantially equal to the battery voltage. This condition prevails as the current at collector 18 increases.

During this time, the voltage induced in the feedback secondary winding 24 drives the base 21 of the other transistor positive with respect to emitter 19, thereby maintaining transistor 11 substantially non-conducting.

While the current at collector 18 increases cumulatively, as described above, it cannot increase abruptly because of the inductance of the upper half of the primary winding 16 through which it flows. Rather, this collector current increases exponentially in accordance with the $L/R$ time constant of the circuit, L being the inductance of the upper half of primary winding 16, and R being the sum of the D.C. winding resistance of the upper half of primary winding 16 and the collector impedance of transistor 10. This collector current increases relatively slowly and exponentially toward a final saturation value, which is determined by the forward bias voltage $E/N$ between the base and emitter of transistor 10, E being the battery voltage and N being the ratio of the number of turns in the upper half of the primary winding 16 to the number of turns in the upper half of the feedback winding 24.

As current saturation is reached at collector 18, the voltage across the upper half of the transformer primary 16 drops to substantially zero because the rate of change of collector current is now substantially zero. When this happens, the induced voltage in the feedback winding 24 also drops to substantially zero, thereby reducing to substantially zero the driving voltage to transistor 10 and removing the reverse bias on the base 21 of transistor 11.

It will be evident that the foregoing operation produces a substantially square wave of voltage across the transformer secondary 26 connected to load 25.

Since the forward bias on transistor 10 has been removed the current at collector 18 decreases. This decrease takes place at a much more rapid rate than the current build-up at collector 18 because now transistor 10 presents a high collector impedance, so that the $L/R$ time constant for this circuit is now much shorter.

The rapid decrease of current at collector 18 induces across the primary winding 16 a high voltage having an instantaneous amplitude measured by $$L\frac{di}{dt}$$

L being the inductance of the primary winding 16 and $$\frac{di}{dt}$$

being the rate of change of current at collector 18. This induced voltage is opposite in sign to that caused by the initial current conduction at collector 18 because $$\frac{di}{dt}$$

has reversed in sign. Accordingly, the collector 19 of transistor 11 is driven positive with respect to the negative battery terminal. In practice, it has been found that this voltage induced by the rapid current decay at collector 18 drives the collector 19 positive with respect to emitter 13, so that briefly the transistor 11 conducts in the reverse direction. However, this condition cannot continue since the rate of increase of current at collector 19 induces a voltage across the lower half of primary winding 16 which opposes that induced by the decay of current at collector 18. After the current at collector 18 has decayed sufficiently the current at collector 19 reverses its direction and begins to operate in the normal direction.

The above-described rapid decay of the current at collector 18 induces in the feedback secondary winding 24 a voltage which forward biases the emitter-base diode portion of transistor 11, tending to cause this transistor to conduct in the forward direction. Accordingly, the positive current at collector 19 increases in exponential fashion, inducing a driving voltage across the secondary feedback winding 24 which maintains base 21 negative with respect to emitter 13. This maintains transistor 11 conducting. At the same time transistor 10 is reverse biased by this driving voltage and hence is non-conducting.

The potential at collector 19 rapidly approaches the emitter potential, so that the voltage across the lower half of primary winding 16 is substantially equal to the battery voltage as the current at collector 19 continues to increase. Thus, a substantially square wave voltage is applied to the load 25.

When current saturation is reached at collector 19 the voltage across the transformer primary 16 drops to substantially zero, as does the voltage induced in the feedback winding 24. With the removal of this driving voltage the current at collector 19 begins to decrease rapidly, inducing a voltage across the transformer primary which causes transistor 10 to begin to conduct in the same fashion as transistor 11 had begun to conduct, as described.

In this manner the transistors 10 and 11 conduct in alternate sequence at a frequency which is inversely proportional to the inductance to the transformer primary 16 and which also depends upon the peak collector current drawn during conduction by each transistor and the voltage of D.C. source 14. Accordingly, any changes in the number of turns of the transformer primary, core area, core material, feedback turns ratio or battery voltage 14 affect the frequency of oscillation. In practice, oscillation frequencies within the range from about 130 to 8,000 cycles per second have been obtained.

From Fig. 1 it will be apparent that resistors 30 and 31 are series-connected across battery 14, so that these resistors draw current from the battery even if neither transistor is conducting. When the first transistor begins to conduct, as described above, a substantial portion of the current through resistor 30 is drawn by the emitter-base portion of the conducting transistor. Thus, the provision of resistors 30 and 31 insures additional current to the transistor which is starting to conduct. This enables positive starting of the oscillator, even under full load. Also, the same action takes place when one transistor cuts off and the other begins to conduct since the resistors provide additional current for the transistor which is just beginning to conduct. Therefore, positive maintenance of oscillations is achieved.

Throughout its conduction cycle the input resistance of each transistor increases. Accordingly, in the absence of the resistors 30 and 31 the base current would decrease appreciably as the transistor input resistance increased. However, by the provision of resistors 30 and 31 the base current is made more stable throughout the conduction cycle. Thus, if resistor 30 is relatively high most of the driving current for the conducting transistor comes from the voltage across the corresponding half of the feedback winding 24 of transformer 17. This major portion of the driving current is equal to this feedback voltage divided by $(R_{in}+R_{31})$, where $R_{in}$ is the input resistance of the conducting transistor and $R_{31}$ is the resistance of resistor 31. By making resistor 31 of the order of 5 to 10 ohms the base current is much less sensitive to changes in the input resistance of the transistor throughout its conduction cycle. This has the effect of changing the distribution of the emitter and collector currents throughout the conduction cycle in such fashion that the power losses in the transistor are reduced.

The circuit embodiment of Fig. 1 is adapted for easy compensation for variations in transistor parameters. Thus, if for some reason, such as low alpha or abnormally high input resistance, a pair of transistors connected in push-pull, as illustrated, does not develop sufficient peak collector current to supply the required load power then resistor 30 can be reduced to provide additional driving current to the base of the conducting transistor. Obviously, this adjustment of a single resistor is an extremely simple arrangement to compensate for unavoidable variations in transistor parameters. In the absence of such an arrangement, the only other possible way to provide compensation would be to change the number of turns on the feedback winding 24 to provide the required driving current. Obviously this would be costly and inconvenient.

Figure 3:
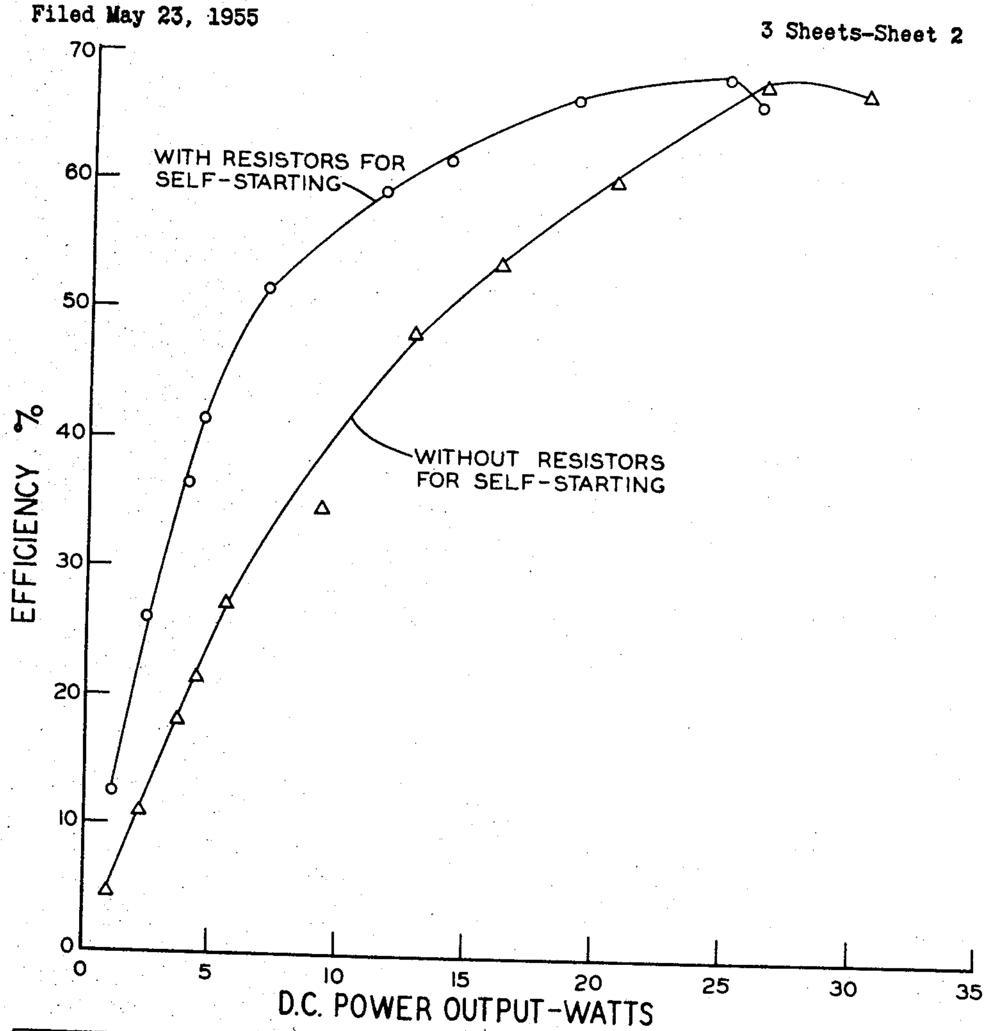
Figure 3 is a graph showing efficiency plotted against power output for the Fig. 1 circuit and an oscillator identical to Fig. 1 except that it lacks the self-starting resistors.

It has been found that the provision of resistors 30 and 31 for the purpose described has comparatively little effect on the full load efficiency of the oscillator, which is of the order of 70%. However, an appreciable increase in efficiency at partial loads has been obtained with this novel circuit arrangement. For example, the performance curves in Fig. 3 demonstrate the improved effect attributable to adding the starting resistor arrangement in a particular transistor oscillator circuit capable of handling 25 watts at an efficiency of 70%. Obviously, the partial load efficiency of the oscillator is much improved. This increase in efficiency is due to the fact that resistor 31 limits the peak value of the base current which occurs at the beginning of the conducting cycle, thus reducing the collector current at the beginning of the conduction cycle, thereby reducing power dissipation in the transistor. This has little effect on the peak collector current occurring at the end of the conduction cycle.

The circuit of Fig. 1 is short-circuit safe since a short circuit load stops the oscillator and the power input becomes quite low.

The Fig. 1 oscillator produces a square wave output, which is advantageous from the aspects of efficiency and voltage regulation.

Figure 2:
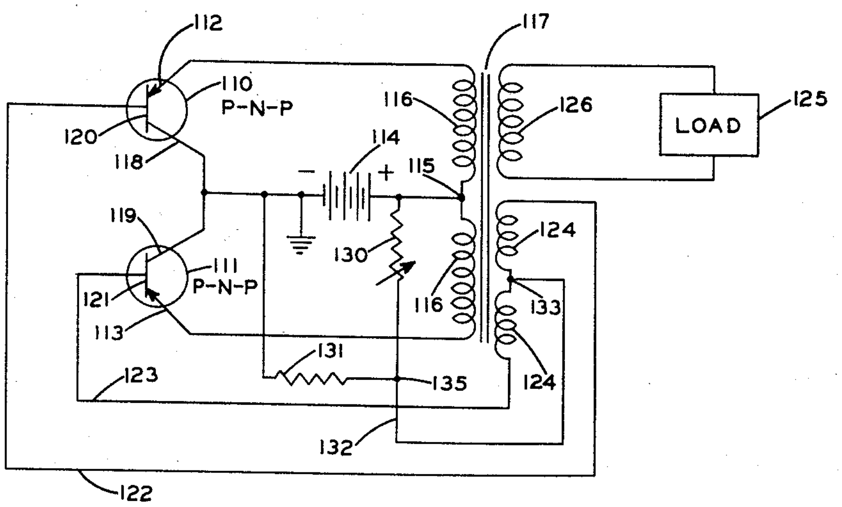
Figure 2 is a circuit diagram of a common-collector transistor oscillator in accordance with this invention.

In Fig. 2 there is illustrated schematically an alternative embodiment of the present invention which is essentially similar to that of Fig. 1 except that in this instance the transistors operate with the collectors connected in common, rather than the emitters, as in the first embodiment. In Fig. 2 a pair of P-N-P transistors 110 and 111 are connected in push-pull relation with their respective collector electrodes 118 and 119 connected directly to the grounded negative terminal of battery 114. Each collector electrode is grounded to the can in which that transistor is mounted, and preferably the can is grounded to the chassis of the apparatus. Thus, the chassis serves as a heat sink which is highly effective in dissipating the heat caused by power losses in the transistors.

The positive terminal of this battery is connected to the center tap 115 on the primary winding 116 of a transformer 117. The opposite ends of the primary winding are connected to the respective emitter electrodes 112 and 113 of the transistors. The base electrodes 120 and 121 of the transistors are connected by lines 122 and 123, respectively, to opposite ends of the secondary feedback winding 124 on the core of transformer 117. Feedback winding 124 has more turns than primary winding 116 in order to supply the required feedback energy to the transistor inputs.

The load 125 is connected across another secondary winding 126 on the transformer core. The secondary winding 126 has a suitable number of turns to apply the desired stepped-up voltage to the load.

In this embodiment a first resistor 130 has one of its terminals connected directly to the positive terminal of battery 114. A second resistor 131 is connected between the opposite end of resistor 130 and ground. A line 132 is connected between the mid-tap 133 on the secondary feedback winding 124 of the transformer and juncture 135 between resistors 130 and 131. The resistors 130 and 131 have the same ohmic values and perform essentially the same function as resistors 31 and 30, respectively, in Fig. 1.

In operation, the impedance arrangement consisting of resistors 130 and 131 connected as described, provides additional driving current which insures positive starting and maintenance of oscillations by the oscillator circuit. The same advantageous results are achieved as in the Fig. 1 arrangement and need not be repeated in detail.

Figure 4:
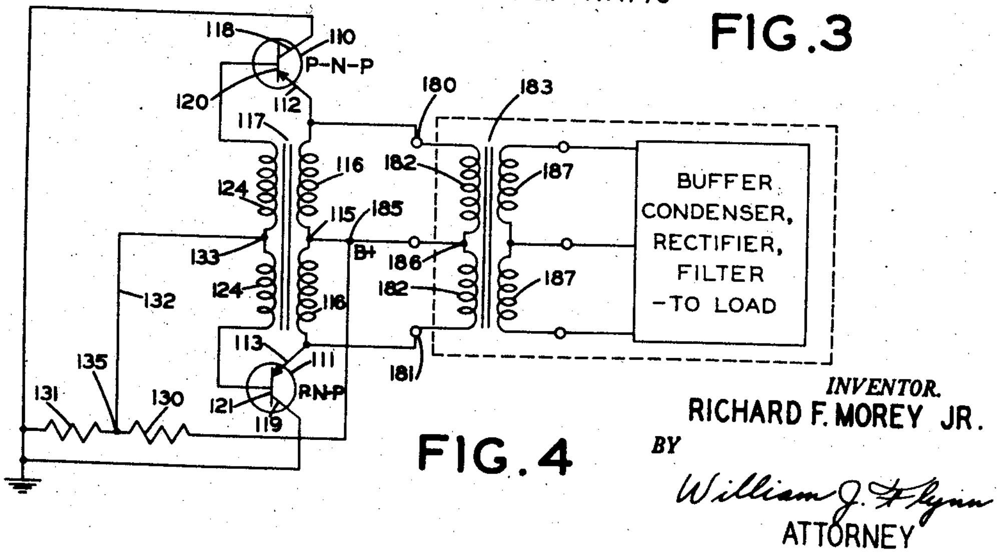
Figure 4 is a circuit diagram showing in full lines a common-collector plug-in transistor unit in accordance with the present invention for substitution in place of a conventional vibrator in a power supply.

One specific use to which the present invention may be put is as a replacement for the vibrator-type power supply now widely used on aircraft. A common-collector, push-pull transistor oscillator of the type shown in Fig. 2 is ideally suited as a plug-in unit to be inserted in place of a vibrator in such a power supply. The battery, power transformer, rectifier and filter of the power supply could be left unchanged, with merely the vibrator being replaced. Figure 4 illustrates how such a transistor oscillator could be inserted into the power supply to replace the vibrator.

The reference numerals in Fig. 4 designate the correspondingly numbered elements described in detail in connection with Fig. 2. The only essential differences are that the battery would not be a part of the transistor oscillator plug-in unit and the transformer 117 has no secondary winding for operating the load. Instead, the opposite terminals of the primary winding 116 of oscillator transformer 117 would be connected directly to the terminals 180 and 181 of the primary winding 182 of the power transformer 183 in the previous power supply. The positive terminal 185 of the power supply battery would be connected directly to the center tap 115 on the primary winding 116 of the oscillator transformer 117 and to a center tap 186 on the primary winding 182 of the power transformer 183.

In operation, the oscillatory voltage produced across the primary 116 of the oscillator transformer 117 is applied to the primary 182 of the power transformer 183. The secondary 187 of the power transformer supplies oscillations to the buffer condenser, rectifier, filter and load in the pre-existing power supply.

In practice, the two transistors 110, 111, transformer 117 and resistors 130 and 131, which make up the oscillator unit, may be packaged in a plug-in container of about the same size as present plug-in vibrator units.

The grounded-collector circuit is advantageous for this and other applications since it permits simpler wiring and the use of the entire chassis as a heat sink for the transistors.

The inductance of the primary winding of the oscillator transformer 117 should be made as high as possible, as by the use of high permeability core material, so that the frequency of oscillation will be low enough that the square wave frequency components will be within the pass band of the power transformer 183.

Figure 5:
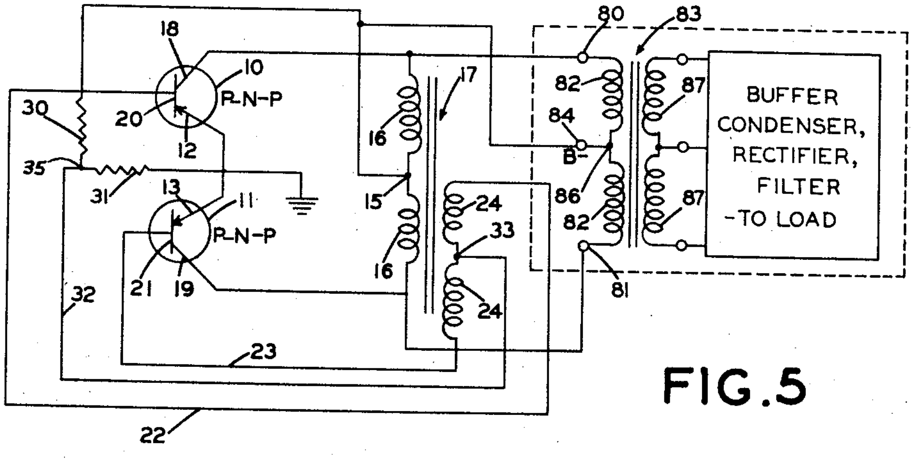
Figure 5 is a circuit diagram showing such a plug-in transistor oscillator unit of the common-emitter type in accordance with the present invention.

A common-emitter ocsillator of the type shown in Fig. 1 may also be employed as a plug-in unit to replace a vibrator in a power supply. Such a plug-in unit is shown in Fig. 5, with the reference numerals designating the same elements as those correspondingly numbered in Fig. 1.

In this unit the battery would not be part of the transistor oscillator plug-in unit and the transformer 17 is not provided with a secondary winding for operating the load. Instead the emitters 12 and 13 are connected directly to ground and the positive terminal of the battery in the pre-existing power supply is grounded. Also, the opposite ends of the primary winding 16 of the oscillator transformer 17 are connected respectively directly to the opposite ends 80 and 81 of the primary winding 82 of the power transformer 83 in the pre-existing power supply. The negative terminal 84 of the battery in this power supply is connected directly to the center tap 15 on the primary winding 16 of the oscillator transformer 17 and to a center tap 86 on the primary winding 82 of the power transformer 83.

In operation, the oscillatory voltage across the primary winding 16 of the oscillator transformer 17 also appears across the primary winding 82 of the power transformer 83. The secondary winding 87 of the power transformer operates the load.

As in the common-collector plug-in unit, the transistors 10, 11, the transformer 17 and the resistors 30, 31 which make up the common emitter oscillator unit may be packaged in a plug-in container of about the same size as present plug-in vibrator units.

Figure 6:
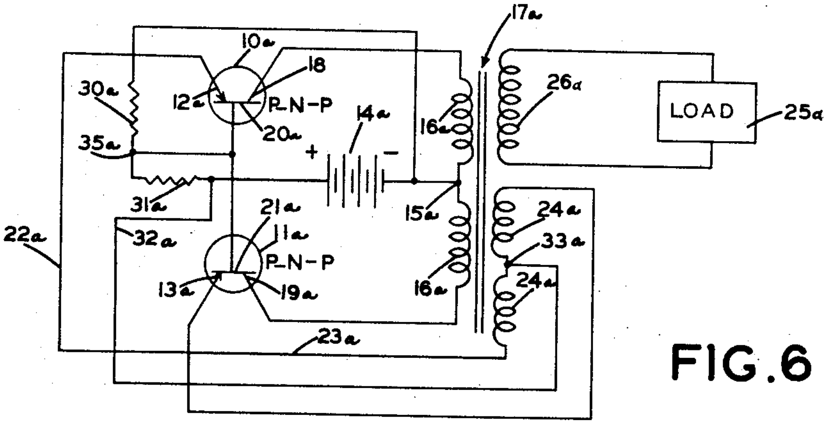
Figure 6 is a circuit diagram of a common-base transistor oscillator embodying the general principles of the present invention.
Figure 7:
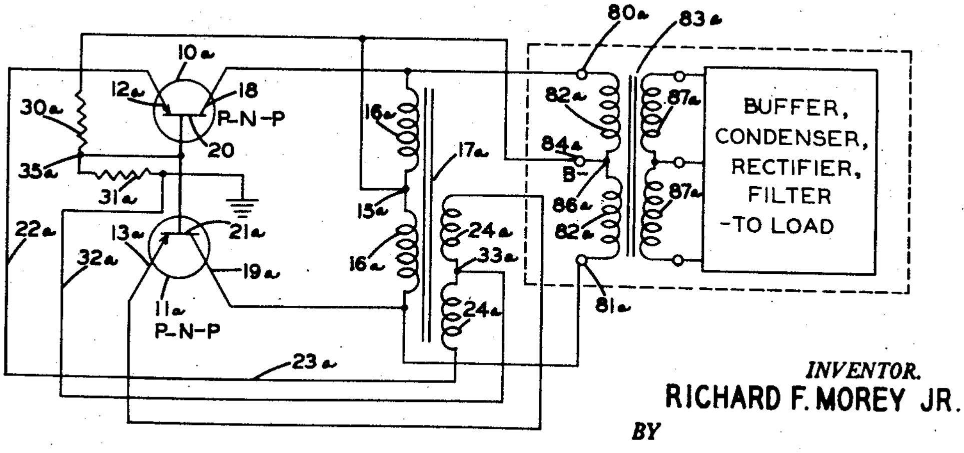
Figure 7 is a circuit diagram showing a plug-in transistor oscillator unit of the common-base type embodying the principles of this invention.

The generic novel principles of the present invention are also susceptible of embodiment in a common-base oscillator, as shown in Fig. 6, or a common-base oscillator plug-in unit as shown in Fig. 7. Corresponding elements are designated by the same numerals as in Fig. 1 and Fig. 5, respectively, with the subscript "*a*" added. Therefore, it is considered unnecessary to recite in detail the circuit connections in Fig. 6 and Fig. 7. The operation of these embodiments is similar to those previously described.

While there have been disclosed herein certain embodiments of the present invention, it is to be understood that various modifications, omissions and refinements which depart from the illustrated embodiments may be adapted without departing from the spirit and scope of this invention.

I claim:

1. A transistor oscillator comprising a transistor which includes a semiconductive body, a base electrode making ohmic contact with the semiconductive body, and an emitter electrode and a collector electrode each making rectifier contact with the semiconductive body, bias connections for said rectifier contact electrodes, input and output circuits for the transistor, a feedback network coupling the output circuit back to the input circuit in energy feedback relation, first resistive impedance means having one of its terminals connected to the bias connection for one of said rectifier contact electrodes, second resistive impedance means connected between the other terminal of said first resistive impedance means and the bias connection for the other of said rectifier contact electrodes, and a connection from the juncture of said first and second resistive impedance means to the feedback circuit.

2. A transistor oscillator comprising a transistor having an input and an output, bias connections for the transistor, a feedback network coupling the transistor output in energy feedback relation to the transistor input and comprising a transformer having a primary winding connected to the transistor output, and a secondary feedback winding inductively coupled to the primary winding and connected to the transistor input and a pair of fixed resistive impedance elements connected in series with each other across said bias connections, one of said resistive impedance elements being connected in said feed back network.

3. A transistor oscillator comprising a transistor having an input and an output, bias connections for the transistor, a feedback network comprising a transformer having its primary winding connected to the output of the transistor and having a secondary feedback winding coupled to the input of the transistor, a pair of resistive impedance elements connected in series with each other across said bias connections, and a connection from the juncture of said resistive impedance elements to the feedback winding of the transformer.

4. A transistor oscillator comprising a transistor having an input and an output, bias connections for the transistor, a feedback network coupling the transistor output in energy feedback relation to the transistor input and comprising a transformer having a primary winding connected to the transistor output and a secondary feedback winding inductively coupled to the primary winding and connected to the transistor input, first resistive impedance means connected directly between one of said bias connections and said feedback winding, and second resistive impedance means connected directly between the other bias connection and said feedback winding.

5. A transistor oscillator comprising a transistor which includes a semiconductor, a base electrode making ohmic contact with the semiconductor, and an emitter electrode and a collector electrode each making rectifier contact with the semiconductor, bias connections for said rectifier contact electrodes, input and output circuits for the transistor, a feedback network coupling the output circuit in energy feedback relation to the input circuit and comprising a transformer having a primary winding connected to the transistor output and a secondary feedback winding inductively coupled to the primary winding and connected to the transistor input, first resistive impedance means having one of its terminals connected to the bias connection for one of said rectifier contact electrodes, second resistive impedance means connected between the other terminal of said first resistive impedance means and the bias connection for the other rectifier contact electrodes, and a connection from the juncture of said first and second resistive impedance means to the said feedback winding.

6. A transistor oscillator comprising a transistor which includes a semiconductor, a base electrode making ohmic contact with the semiconductor, and an emitter electrode and a collector electrode each making rectifier contact with the semiconductor, bias connections for said rectifier contact electrodes, a transformer having a primary winding connected between one of said rectifier contact electrodes and the bias connection therefor, a secondary feedback winding on the transformer inductively coupled to said primary winding and connected to the base electrode, first resistive impedance means connected between the bias connection for said one rectifier contact electrode and said secondary winding, and second resistive impedance means connected between said first resistive impedance means and the other bias connection.

7. A transistor oscillator comprising a pair of transistors connected in push-pull relation and each having an input and an output, a pair of bias terminals for the transistors, a transformer having a primary winding connected across the outputs of the respective transistors, a center tap on said primary winding connected directly to one of said bias terminals, a secondary feedback winding on the transformer inductively coupled to said primary winding and connected at its opposite ends to the inputs of the respective transistors, a pair of resistive impedance elements connected in series with each other across said bias connections, and a connection from the juncture of said resistive impedance elements to a center tap on said feedback winding.

8. A transistor oscillator comprising a pair of transistors each of which comprises a semiconductive body, a base electrode in ohmic contact with the semiconductive body, and an emitter electrode and a collector electrode each making rectifying contact with the semiconductive body, a pair of bias terminals for the transistors, a transformer having a primary winding connected at its opposite ends to corresponding rectifying contact electrodes on the respective transistors, a connection from a center tap on said primary winding to one of said bias terminals, a secondary feedback winding on the transformer inductively coupled to said primary winding and connected at its opposite ends to corresponding other electrodes on the respective transistors, and a pair of resistive impedance elements connected in series with each other across said bias terminals, the juncture of said resistive impedance elements being connected directly to a center tap on said feedback winding.

9. A transistor oscillator comprising a pair of transistors, each of which comprises a semiconductive body, a base electrode in ohmic contact with the semiconductive body, and an emitter electrode and a collector electrode each making rectifying contact with the semiconductive body, a pair of bias terminals for the transistors, a transformer having a primary winding connected at its opposite ends to corresponding rectifying contact electrodes on the respective transistors, a connection from a center tap on said primary winding to one of said bias terminals, a secondary feedback winding on the transformer inductively coupled to said primary winding and connected at its opposite ends to corresponding other electrodes on the respective transistors, first resistive impedance means connected between said one bias terminal and a center tap on said feedback winding, and second resistive impedance means connected between the center tap on said feedback winding and the other bias terminal.

10. A transistor oscillator comprising a pair of transistors, each of which comprises a semiconductor, a base electrode making ohmic contact with the semiconductor, and an emitter electrode and a collector electrode each making rectifier contact with the semiconductor, a pair of positive and negative power supply terminals for the transistors, a transformer having a primary winding connected at its opposite ends to corresponding rectifier contact electrodes on the respective transistors, a center tap on said primary winding connected to one of said power supply terminals, the other of said power supply terminals being connected directly to each of the corresponding other rectifier contact electrodes on the respective transistors, a secondary feedback winding on the transformer inductively coupled to said primary winding and connected at its opposite ends to the base electrodes on the respective transistors, first resistive impedance means connected between said one power supply terminal and a center top on said feedback winding, and second resistive impedance means connected between said center tape on said feedback winding and said other power supply terminal.

11. The oscillator of claim 10, wherein said primary winding on the transformer is connected at its opposite ends to the respective collector electrodes, and said other power supply terminal is connected to each emitter electrode.

12. The oscillator of claim 10, wherein said primary winding on the transformer is connected at its opposite ends to the respective emitter electrodes, and said other power supply terminal is connected to each collector electrode.

13. A transistor oscillator comprising a pair of transistors, each of which comprises a semiconductor, a base electrode making ohmic contact with the semiconductor, and an emitter electrode and a collector electrode each making rectifier contact with the semiconductor, a pair of positive and negative power supply terminals for the transistors, a transformer having a primary winding connected at its opposite ends to corresponding rectifier contact electrodes on the respective transistors, a center tap on said primary winding connected directly to one of said power supply terminals, the other power supply terminal being connected directly to each of the corresponding other rectifier contact electrodes on the respective transistors, said transformer having a secondary feedback winding inductively coupled to said primary winding and connected at its opposite ends to the base electrodes on the respective transistors, first and second resistive impedance means connected in series with each other across said power supply connections, and a center tap on said feedback winding connected directly to the juncture of said first and second impedance means.

References Cited in the file of this patent

UNITED STATES PATENTS

| | | |
|---|---|---|
| 2,745,009 | Jean-Marie Moulon | May 8, 1956 |
| 2,748,274 | Pearlman | May 29, 1956 |
| 2,757,243 | Thomas | July 31, 1956 |
| 2,760,070 | Keonjian | Aug. 21, 1956 |
| 2,774,875 | Keonjian et al. | Dec. 18, 1956 |

OTHER REFERENCES

Article: "An Amplitude Stabilized Transistor Oscillator," by Kretzmer, from P.I.R.E., vol 42, pages 391–401 for February 1954.

"Point Contact and Junction Transistors," by Doremus; from Radio and Television News, vol. 47, No. 4, pages 14–20 for April 1952.

"Complementary Symmetry Transistor Circuits," by Lohman, pages 140–143 of Electronics for September 1953.